(12) United States Patent
Kimura

(10) Patent No.: US 6,699,740 B2
(45) Date of Patent: Mar. 2, 2004

(54) METHOD FOR MANUFACTURING A LATERAL DOUBLE-DIFFUSED MOS TRANSISTOR HAVING STABLE CHARACTERISTICS AND EQUAL DRIFT LENGTH

(75) Inventor: Isao Kimura, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/075,277

(22) Filed: Feb. 15, 2002

(65) Prior Publication Data

US 2003/0064560 A1 Apr. 3, 2003

(30) Foreign Application Priority Data

Oct. 3, 2001 (JP) ........................................ 2001-307283

(51) Int. Cl.⁷ ............................................. H01L 21/336
(52) U.S. Cl. ...................... 438/197; 438/228; 438/286; 438/301; 438/585
(58) Field of Search ................................. 438/197, 286, 438/289, 585, 228, 299, 301

(56) References Cited

U.S. PATENT DOCUMENTS

2003/0040159 A1 * 2/2003 Sasaki .......................... 438/286

FOREIGN PATENT DOCUMENTS

| JP | 62-265765 | 11/1987 |
|----|-----------|---------|
| JP | 1-199468 | 10/1989 |
| JP | 10-335663 | 12/1998 |
| JP | 11-31816 | 2/1999 |
| JP | 2000-216261 | 4/2000 |
| JP | 2001-307283 | 10/2001 |

OTHER PUBLICATIONS

Patent Abstracts of Japan, Publication No. 2000–216261, Date of Publication of Application Apr. 8, 2000.
Patent Abstracts of Japan, Publication No. 11–031816, Date of Publication of Application Feb. 2, 1999.
Patent Abstracts of Japan, Publication No. 10–335663, Date of Publication of Application Dec. 18, 1998.
Patent Abstracts of Japan, Publication No. 01–199468, Date of Publication of Application Oct. 8, 1989.
Patent Abstracts of Japan, Publication No. 62–265765, Date of Publication of Application Nov. 18, 1987.

* cited by examiner

*Primary Examiner*—Jack Chen
(74) *Attorney, Agent, or Firm*—Volentine Francos, PLLC

(57) ABSTRACT

A semiconductor device including a P-type semiconductor layer; an N-type first well on the surface of the semiconductor layer; a P-type second well on the surface of the first well; an N-type source region on the surface of the second well; and an N-type drain region on the surface of the first well and apart from the source region at a specific distance. A gate electrode is formed on the semiconductor layer and extends from the source region to the second well and the first well. An application electrode is arranged apart from the gate electrode on the first well between the second well and the drain region, and extends from the first well to the edge thereof. A P-type first impurity diffusion layer is formed on the surface of the source region and extends to the second well under the source region.

15 Claims, 6 Drawing Sheets

METHOD FOR MANUFACTURING A LATERAL DOUBLE-DIFFUSED MOS TRANSISTOR HAVING STABLE CHARACTERISTICS AND EQUAL DRIFT LENGTH

BACKGROUND OF THE INVENTION

1. Field of the Invention

The present invention relates to a semiconductor device and its manufacturing method excellent at characteristics of break down voltage and on resistance and the like.

2. Description of the Related Art

An LDMOS (lateral double-diffused metal oxide semiconductor) transistor is well known as a power device that is small in size and low in power consumption. The publication of unexamined application, JP10-335663, discloses the structure and manufacturing method thereof.

A conventional LDMOS transistor is manufactured as follows. A P$^-$-type epitaxial layer (a first region) is formed on a substrate of a P$^+$-type semiconductor. A second region as an N$^-$-type well is formed on the first region. A third region of P$^-$-type as a D-well is formed inside the second region and a gate is formed on at least a part of the third region while an N-type RSD (reduced surface drain) region is formed inside the second region.

A first side of the RSD region matches a first side of the gate and spreads out of the gate. An N$^+$-type source region and a P$^+$-type back gate region are formed inside the third region. The third region is formed between a source region and the RSD region to form a channel. The source region is formed under a second side of the gate and spaced-from the RSD region. On the other hand, an N$^+$-type drain region is formed inside the second region and spaced from the first side of the gate. The concentrations of the added impurity in the source region and drain region are higher than that in the RSD region.

In the steps of creating a photoresist patterning and depositing, introducing and diffusing of various kinds of materials, a semiconductor manufacturing technology that has been already known is used.

Generally in the LDMOS transistor, the resistance path is expressed by the sum of channel length L and drift length Ld, that is, L+Ld. When the drift length Ld changes, on resistance Rsp and breakdown voltage BV change accordingly, as disclosed in JP10-335663.

According to the conventional method for manufacturing an LDMOS transistor as described above, however, the gate and the drain region are respectively formed in different steps and by a photolithography technology, in which different masks are used. For this reason, the locations at which the gate region and the drain region are formed have to be aligned. Consequently, the displacement of alignment thereof occurs in the semiconductor manufacturing technology that has been already known. The displacement of alignment like this causes unequal values of the drift length Ld and an unstable characteristic of the semiconductor device in the process of mass-producing.

SUMMARY OF THE INVENTION

The object of the present invention to provide a novel and improved semiconductor device having a stable element characteristic without making the values of the drift length Ld unequal in manufacturing.

In the present invention to achieve the above object, there is provided a semiconductor device comprising: a semiconductor layer of a first conductive type; a first well of a second conductive type formed on the surface of the semiconductor layer; a second well of the first conductive type formed on the surface of the first well; a source region of the second conductive type formed on the surface of the second well; a drain region of the second conductive type formed on the surface of the first well and formed apart from the source region at a specific distance; a gate electrode formed on the semiconductor layer and extending from the source region to the second well and the first well; an application electrode arranged apart from the gate electrode, arranged on the first well between the second well and the drain region and extending from the first well to the edge of the first well contacting the drain region; and a first impurity diffusion layer of the first conductive type formed on the surface of the second well and reaching the second well under the source region.

It is to be noted that the first conductive type corresponds to P-type and the second conductive type to N-type, or conversely, the first conductive type may correspond to P-type and the second conductive type to N-type, as in the normal MOS transistor. These relations can be adopted to the following description.

Also in the present invention to achieve the above object, there is provided a method for manufacturing a semiconductor device comprising the steps of: forming a first well of a second conductive type on the surface of a semiconductor layer of a first conductive type surrounded by an element separated region; forming a second well of the first conductive type on the surface of the first well; forming a source region on the surface of the second well; forming a conductive film on the upper surface of the semiconductor layer; patterning the conductive film; forming a gate electrode on the semiconductor layer to extend from the source region to the second well and the first well; forming a mask on the first well arranged apart from the gate electrode; forming a first resist mask, the one end of which is arranged on the mask while the surface of the first well between the element separating region and the mask is exposed, on the semiconductor layer including the gate electrode and the mask; forming a drain region on the surface of the first well by introducing an impurity of the second conductive type with the first resist mask as a mask; forming a second resist mask, the one end of which is arranged on the mask while the surface of the first well between the element separating region and the mask is exposed, on the semiconductor layer including the gate electrode and the mask; and forming a second impurity diffusion layer, which has a concentration of an impurity lower than that of the drain region and which is connected to the drain region, on the surface of the first well by introducing an impurity of the second conductive type with the first resist mask as a mask.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1A:
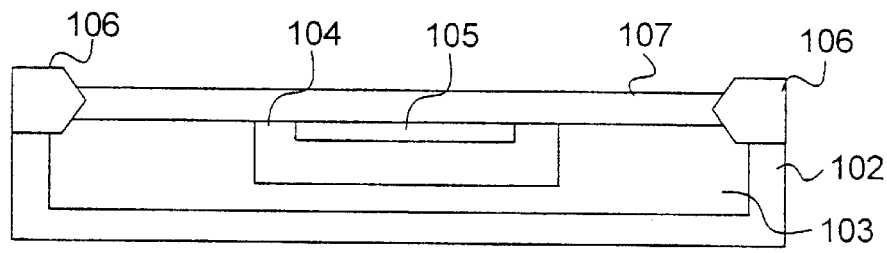
FIGS. 1(a), (b), (c), (d) and (e) are cross-sectional elevational views showing the structure and manufacturing step of an LDMOS transistor in the first embodiment of the present invention.

Hereinafter, the preferred embodiments of the present invention will be described in reference to FIGS. 1–3, which are cross-sectional elevational views showing the structure and manufacturing step of an LDMOS transistor.

(First Embodiment)

FIG. 1 shows an LDMOS transistor 101 in the first embodiment of the present invention, which is manufactured in the following steps.

A first well 103 of a second conductive type is formed as a drain on a semiconductor layer 102 of a first conductive type. Next, a second well (D-well) 104 of the first conductive type is formed in a partial region of the first well 103. And then, a source region 105 is formed in a partial region of the second well 104.

A field oxide film 106 consisting of an insulating material is formed around an element formed on the first well 103 as an isolation region. Then a gate oxide film 107 consisting of an insulating material is formed to be surrounded by the field oxide film 106, and at the same time, on the first well 103 (FIG. 1(a)).

The steps of forming the first well 103, the second well 104, the source region 105, the field oxide film 106 and the gate oxide film 107 can be achieved by using the same method as the conventional one.

In the next, a conductive film made of a conductive material such as polycrystalline silicon is formed on the gate oxide film. After that, the conductive film is patterned to form a gate electrode 108 and a mask 112 apart from the gate electrode 108 on the semiconductor layer through the gate oxide film. At this time, the gate electrode 108 is formed on the semiconductor layer and located to extend from the source region 105 to the second well 104 and the first well 103. In other words, the gate electrode 108 is formed to cover the part extending from at least a part of the first well 103 to a part of the source region 105 via the second well 104 located between a part of the first well 103 and a part of the source region 105. Also, the mask 112 is formed on a second impurity diffusion layer (RSD) 110 to cover the part extending from the second impurity diffusion layer (RSD) 110 to the edge thereof contacting a drain region 109d as a drain electrode-connection region to be formed later.

In other words, the gate electrode 108 made of polycrystalline semiconductor is arranged on the first well 103 of the second conductive type through the gate oxide film 107 to cover the joining part of the second well 104 and the source region 105 and the joining part of the first well 103 and the second well 104. On the other hand, the mask 112 made of polycrystalline semiconductor to inject an impurity is arranged on the first well 103 of the second conductive type through the gate oxide film 107 and, at the same time, around the drain electrode-connection region.

The gate electrode 108 and the mask 112 are formed at the same time and can be formed by using a well-known photolithography/etching technology after a polycrystalline silicon is generated by using a well-known CVD method, for example.

Figure 1B:
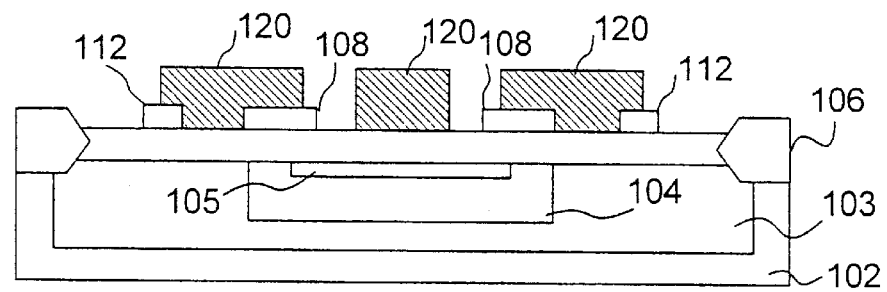

Next, a first resist mask 120 used to form a drain region is formed by forming a resist on the semiconductor layer including the gate electrode 108 and the mask 112 to implement a photolithography method and an etching. The first resist mask 120, the edge of which is located on the mask 112, makes a first diffusion layer between the edge thereof and the field oxide film opposing the edge of the mask exposed. Also in this embodiment as shown in FIG. 1(b), a source electrode-connection region 109s is formed in the same step as that of forming the drain region 109d by using the first resist mask 120. Preferably for this reason, the first resist mask 120 in this embodiment, the edge of which is located on the mask, makes a first well 103 between the edge thereof and the field oxide film 106 opposing the edge of the mask exposed, and it is preferable to use a resist mask making the source region 105 in which the source electrode-connection region 109s is formed exposed (FIG. 1(b)).

An impurity is injected by using the first resist mask 120 as a mask, the drain region 109d of the second conductive type is formed in the first well 103 by self-alignment and the source electrode-connection region 109s is formed in the source region 105 by self-alignment, after the first resist mask 120 is formed. The self-alignment forming of the drain region 109d of the second conductive type is achieved by, for example, a well-known photolithography/implanting technology, introducing an arsenic (As) with the energy amount approximately at 60 keV and the dosage approximately at $1 \times 10^{\cdot}$ /cm$^2$ into the source electrode-connection region 109s and the drain electrode-connection region 109d.

Figure 1C:
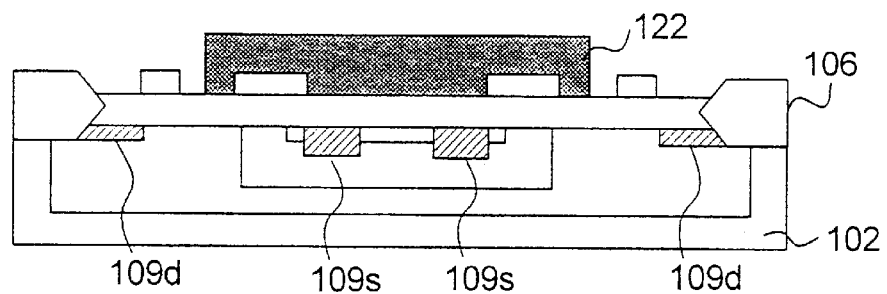
Figure 1D:
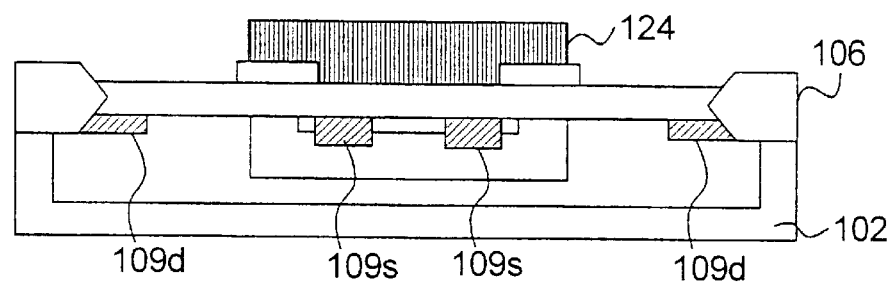
Figure 1E:
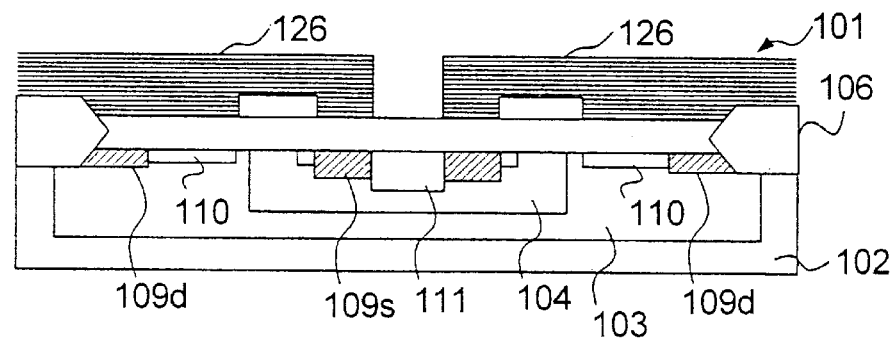

After that, the first resist mask 120 is removed, and a resist mask 122 covering the gate electrode 108 is formed as shown in FIG. 1(c). And then the mask 112 made of a conductive film is removed by etching, using the resist mask 122 covering the gate electrode 108 as a mask. As an etching method in this step, dry etching or wet etching in which a mixed solution of hydrofluoric acid and nitric acid is used, are used.

In removing the mask by these etching methods, however, although the mask desired to be removed can be removed, there is a fear that the gate electrode made of the same conductive film is to be removed at the same time. For this reason in this embodiment, it is necessary to cover the gate electrode adjacent the mask with a resist and the like in order to protect the gate electrode before the mask is removed. And preferably, the gate electrode is located apart from the mask at a distance, at least, that the gate electrode can be protected in removing the mask, more specifically, at more than a distance that the resist and the like can cover the gate electrode.

Also preferably, the width of the mask has the length measured from the location apart from the gate electrode at a specific distance to the edges of the drain region 109d and second impurity diffusion layer (RSD) 110, more specifically, more than 0.3 μm, in order to form the drain electrode-connection region by using the first resist mask 120 provided on the mask and a partial area of the mask 112 made of the conductive layer, as a mask. The reason for this is that the drain region 109d can be formed by self-alignment of the mask 112 and field oxide film 106 by using a wider mask even if the location at which the first resist mask is formed is displaced in a width direction of the mask 112, according to this embodiment. In other words, the size of the drain region 109d can be decided by the distance between the mask 112 and the field oxide film 106 (FIG. 1(d)).

After that, a second resist mask 124 used to form a second impurity diffusion region (RSD) of the second conductive type is formed by forming a resist on the semiconductor layer including the gate electrode to implement a photolithography method and an etching. The second resist mask 124, the edge of which is located on the gate electrode, makes the first well 103 between the edge thereof and the field oxide film opposing the edge of the gate electrode exposed.

An impurity is injected by using the second resist mask 124 as a mask, the second impurity diffusion layer (RSD) 110 of the second conductive type with an impurity concentration lower than that of the drain region 109$d$ is formed in the first well 103, after the second resist mask 124 is formed. The formation of the second impurity diffusion layer (RSD) 110 is achieved by, for example, a well-known photolithography/implanting technology, introducing an arsenic (As) with the energy amount approximately at 30 keV and the dosage approximately at $1\times10^{13}/cm^2$ into the RSD region. At this time, although the impurity is also injected into the drain region 109$d$ formed earlier, the drain region 109$d$ is not influenced since the impurity injection to form the second impurity diffusion layer (RSD) 110 is achieved at a concentration lower than that in forming the drain region 109$d$. By implementing these steps, the second impurity diffusion layer (RSD) 110 contacting the drain region 109$d$ formed earlier is formed (FIG. 1($e$)).

A first impurity diffusion layer 111 of a first conductive type as a D-well connection region is formed on a partial region of the source region 105 to be continuous with the inside of the second well 104 by using a fourth resist mask 126 as a mask. This can be achieved by, for example, a well-known photolithography/implanting technology, introducing a boron (B) with the energy amount approximately at 30 keV and the dosage approximately at $1\times10^{15}/cm^2$ into the D-well connection region and by a well-known diffusion technology.

Finally, a contact and wiring are formed by a conventional method (not shown).

In the first embodiment, a semiconductor manufacturing technology that has been already known can be used to implement the photolithography and etching technology and the steps of depositing, introducing and diffusing of various kinds of materials and forming the contact and wiring. This is the same in the second and the third embodiments.

According to the first embodiment of the present invention, there is provided a semiconductor device comprising: a semiconductor layer of a first conductive type; a first well of a second conductive type formed on the surface of the semiconductor layer; a second well of the first conductive type formed on the surface of the first well; a source region of the second conductive type formed on the surface of the second well; a drain region of the second conductive type formed on the surface of the first well and formed apart from the source region at a predetermined distance; a gate electrode formed on the semiconductor layer and extending from the source region to the second well and the first well; an impressed electrode arranged apart from the gate electrode, arranged on the first well between the second well and the drain region and extending from the first well to the edge of the first well contacting the drain region; and a first impurity diffusion layer of the first conductive type formed on the surface of the second well and reaching the second well under the source region.

According to the first embodiment of the present invention, by forming the gate electrode 108 on the first well through the gate oxide film and forming the mask 112 to inject the impurity around the drain electrode-connection region at the same time, and by forming the drain electrode-connection region 109$d$ by self-alignment using the mask 112 and the gate electrode 108 as a mask, there can be provided an LDMOS transistor capable of refraining the values of the drift length Ld from being unequal in manufacturing in which a photolithography method is used and of having stable characteristics of break down voltage and on resistance and the like.

(Second Embodiment)

FIG. 2 shows an LDMOS transistor 201 in the second embodiment of the present invention, which is manufactured in the following steps.

A first well 203 of a second conductive type is formed as a drain on a semiconductor layer 202 of a first conductive type. Next, a second well (D-well) 204 of the first conductive type is formed in a partial region of the first well 203. And then, a source region 205 is formed in a partial region of the second well 204.

A field oxide film 206 consisting of an insulating material is formed around an element formed on the first well 203 as an isolation region. Then a gate oxide film 207 consisting of an insulating material is formed to be surrounded by the field oxide film 206, and at the same time, on the first well 203 (FIG. 2($a$)).

The steps of forming the first well 203, the second well 204, the source region 205, the field oxide film 206 and the gate oxide film 207 can be achieved by using the same method as the conventional one.

In the next, a conductive film made of a conductive material such as polycrystalline silicon is formed on the gate oxide film. After that, the conductive film is patterned to form a gate electrode 208 and a mask 212 apart from the gate electrode 208 on the semiconductor layer through the gate oxide film (FIG. 2($b$)).

The gate electrode 208 and the mask 212 are formed at the same time as in the first embodiment. At this time, the width of the mask 212 formed to enclose the drain electrode-connection region 109$d$ and to inject an impurity is preferably at 0.2 $\mu$m (FIG. 2($c$)).

Next, the drain electrode-connection region 209$d$ is formed by self-alignment using the mask 212 and the gate electrode 208 as a mask. And then a second impurity diffusion layer (RSD) 210 is formed in the first well 203 by using the gate electrode as a mask so that the diffusion layer may reach under the mask by the diffusion in a horizontal direction.

The second impurity diffusion layer 210 is formed to be continuous with the drain electrode-connection region 209$d$. The self-alignment formation of the drain electrode-connection region 209$d$ and the formation of the second impurity diffusion layer 210 can be achieved as in the first embodiment (FIG. 2($d$)).

In this embodiment, the drain region and the RSD region are formed by using the mask 212 with the narrower width than that of an impurity region diffusing in a horizontal direction in a heat treatment implemented later. Thereby the RSD region can be formed without removing the mask 212.

In forming a typical RSD region with the joining depth approximately at 0.3 $\mu$m as in this embodiment, an impurity injected into the RSD region diffuses in a horizontal direction by roughly 0.2 $\mu$m as well as in the joining depth direction with a heat treatment implemented after the impurity injection into the RSD region, for example, at 900° C. and for 20–30 minutes. Therefore, if the impurity is injected to form the RSD region by using a mask with the width of roughly 0.2 μm, the impurity diffuses under the mask 212 to make it possible to form the RSD region contacting the drain region formed earlier without removing the mask 212.

Figure 2A:
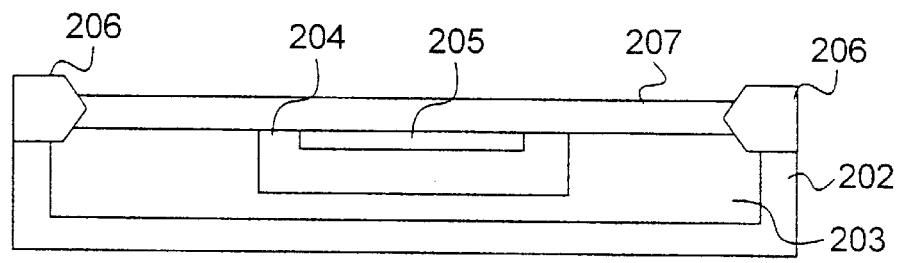
FIGS. 2(a), (b), (c), (d) and (e) are cross-sectional elevational views showing the structure and manufacturing step of an LDMOS transistor in the second embodiment of the present invention.
Figure 2B:
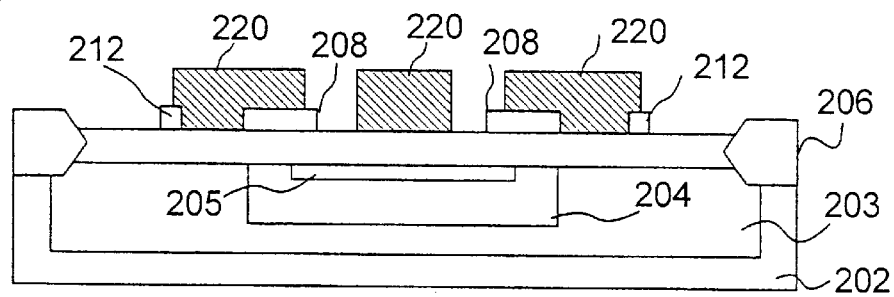
Figure 2C:
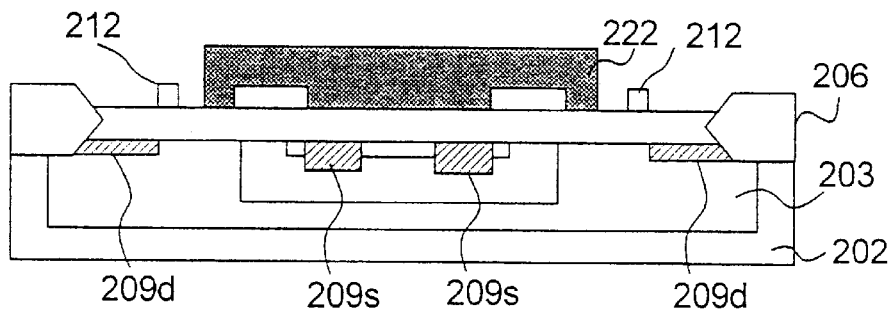
Figure 2D:
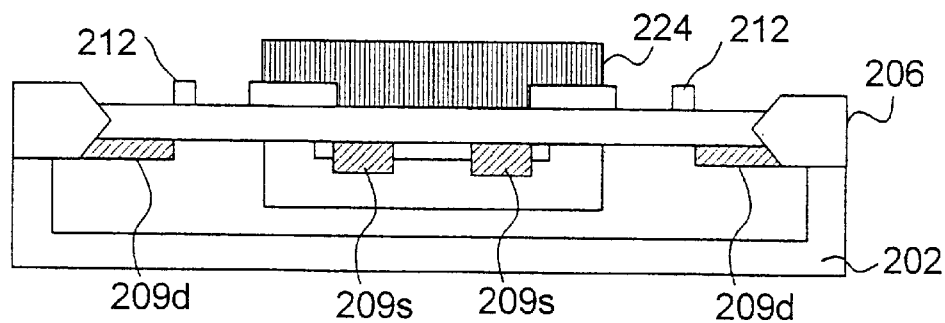
Figure 2E:
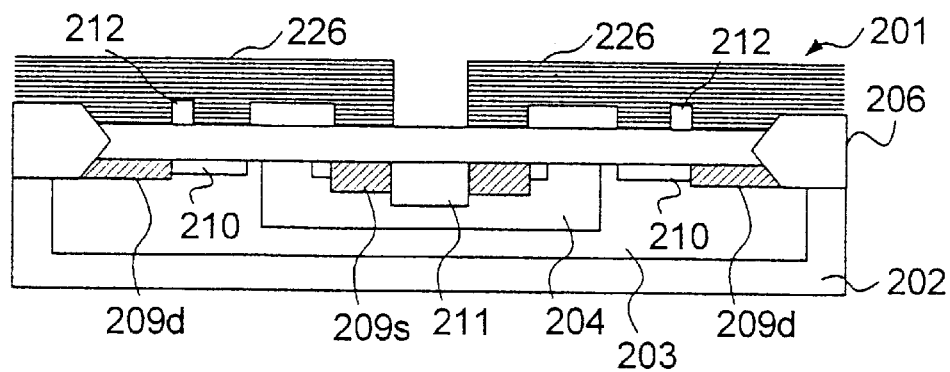

A first impurity diffusion layer 211 of a first conductive type as a D-well connection region is formed on a partial region of the source region 205 to be continuous with the inside of the second well 204 (FIG. 2(e)). And finally, a contact and wiring are formed by a conventional method (not shown).

According to the second embodiment of the present invention, the following effect can be obtained as well as that in the first embodiment. The step of removing the mask can be omitted without deteriorating the characteristics, compared to the first embodiment, by forming the second impurity diffusion layer 210 preferably becoming continuous with the first well 203 with the diffusion in a horizontal direction, in the first well 203.

(Third Embodiment)

FIG. 3 shows an LDMOS transistor 301 in the third embodiment of the present invention, which is manufactured in the following steps.

A first well 303 of a second conductive type is formed as a drain on a semiconductor layer 302 of a first conductive type. Next, a second well (D-well) 304 of the first conductive type is formed in a partial region of the first well 303. And then, a source region 305 is formed in a partial region of the second well 304.

A field oxide film 306 is formed around an element formed on the first well 303 as an isolation region. Then a gate oxide film 307 consisting of an insulating material is formed to be surrounded by the field oxide film 306, and at the same time, on the first well 303 (FIG. 3(a)). The steps of forming the first well 303, the second well 304, the source region 305, the field oxide film 306 and the gate oxide film 307 can be achieved by using the same method as the conventional one.

In the next, a conductive film made of a conductive material such as polycrystalline silicon is formed on the gate oxide film. After that, the conductive film is patterned to form a gate electrode 308 and a mask 312 apart from the gate electrode 308 on the semiconductor layer through the gate oxide film (FIG. 3(b)).

An electron is stored and the reach through from the second well (D-well) 304 is controlled as in the RSD layer to reduce the on resistance by using the mask 312 formed around the drain electrode-connection region as an electrode setting the surface of the first well 303 as a storing direction to apply a voltage. Also, the amount of electric charge to be stored can be controlled by the amount of applied voltage.

Figure 3A:
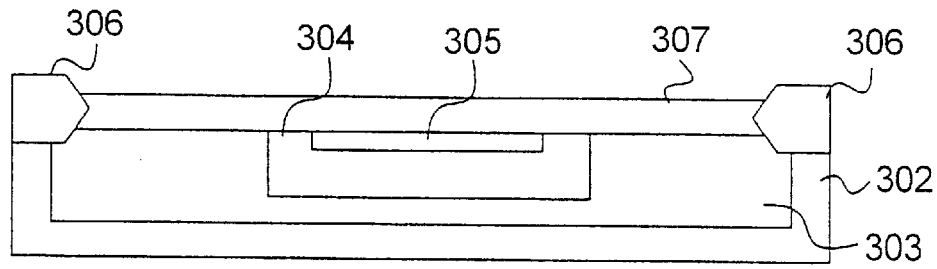
FIGS. 3(a), (b), (c), (d) and (e) are cross-sectional elevational views showing the structure and manufacturing step of an LDMOS transistor in the third embodiment of the present invention.
Figure 3B:
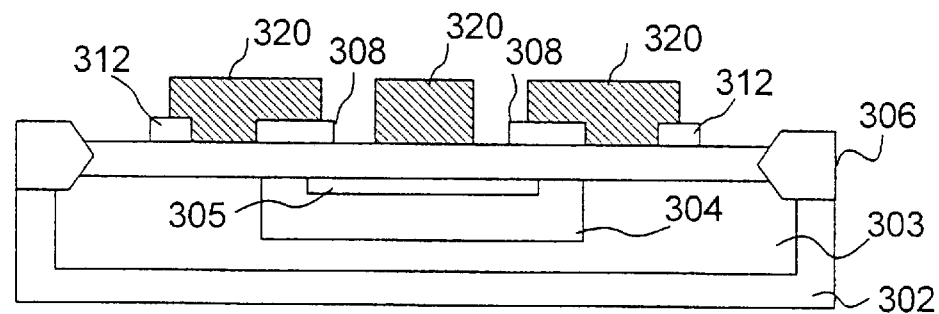
Figure 3C:
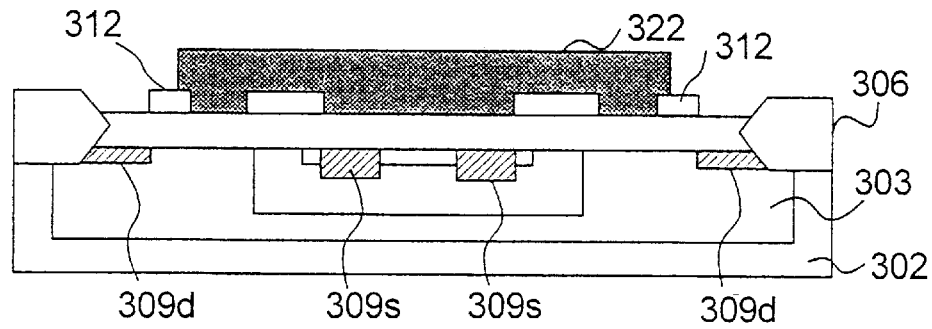
Figure 3D:
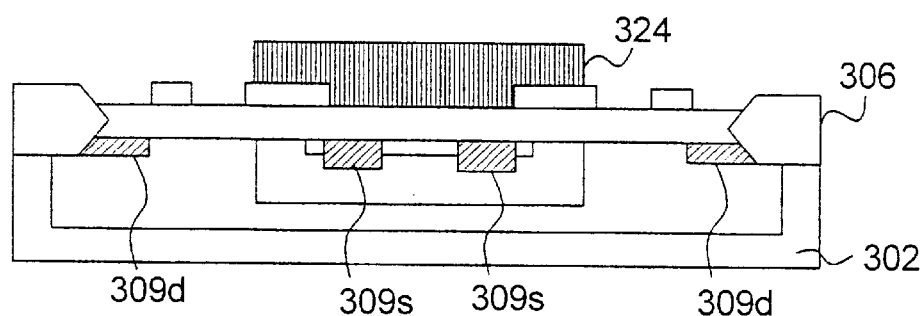
Figure 3E:
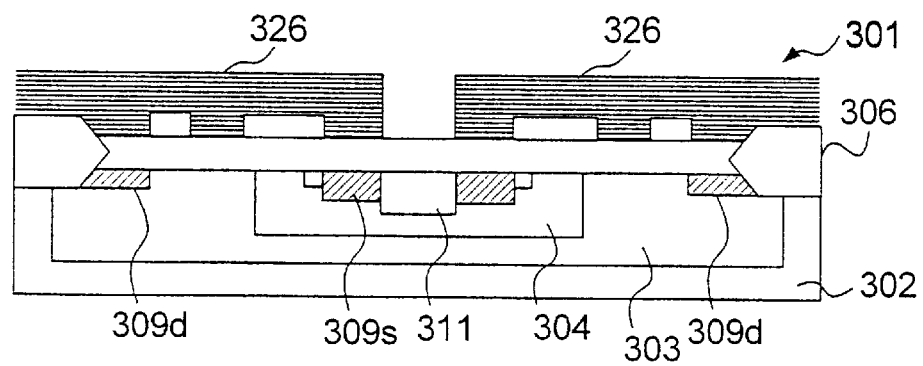

The gate electrode 308 and the mask 312 can be formed as in the first embodiment (FIGS. 3(c) and (d)). It is to be noted that the gate electrode 308 and the mask 312 must not be continuous with each other since an electron is stored and the reach through from the D-well diffusion layer is controlled by providing an electrode setting the surface of the first well of the second conductive type adjacent with the gate electrode as a storing direction to apply a voltage in this embodiment. To realize a semiconductor device capable of controlling the occurrence of the reach through and operating with low power consumption, it is preferable to set a distance between the gate electrode 308 and the mask 312 as short as possible, at the minimum distance less than which the gate electrode 308 and the mask 312 contact each other.

Next, the drain electrode-connection region 309d is formed by self-alignment using the mask 312 and the gate electrode 308 as a mask. And then a first impurity diffusion layer 311 of a first conductive type as a D-well connection region is formed on a partial region of the source region 305 to be continuous with the inside of the second well 304 (FIG. 3(e)). And finally, a contact and wiring are formed by a conventional method (not shown).

According to the third embodiment of the present invention, the following effect can be obtained as well as those in the first and second embodiments. The step of forming the second impurity diffusion layer (RSD) can be omitted to reduce the step greatly on the whole by forming an electrode made of polycrystalline semiconductor and setting the surface of the first well 303 as a storing direction to apply a voltage.

According to the third embodiment, the conventional necessity of revising the RSD condition to change a specification voltage is deleted, and there can be provided an LDMOS transistor available -in various amounts of specification voltage only by changing the voltage applied to the gate electrode 308.

Although the preferred embodiment of the present invention has been described referring to the accompanying drawings, the present invention is not restricted to such examples. It is evident to those skilled in the art that the present invention may be modified or changed within a technical philosophy thereof and it is understood that naturally these belong to the technical philosophy of the present invention.

What is claimed is:

1. A method for manufacturing a semiconductor device comprising:

forming a first well of a second conductive type on a surface of a semiconductor layer of a first conductive type surrounded by an element separation region;

forming a second well of the first conductive type on a surface of the first well;

forming a source region on a surface of the second well;

forming a conductive film on an upper surface of the semiconductor layer;

patterning the conductive film to form a gate electrode and a mask, the gate electrode being formed on the semiconductor layer to extend from the source region to the second well, and the mask being formed on the first well arranged apart from the gate electrode;

forming a first resist mask on the semiconductor layer including the gate electrode and the mask, an end of the first resists mark being arranged on the mask so that a part of the surface of the first well between the element separation region and the mask is exposed;

forming a drain region on the surface of the first well by introducing an impurity of the second conductive type using the first resist mask;

removing the first resist mask;

forming a second resist mask on the semiconductor layer including the gate electrode mask, an end of the second resist mask being arranged on the mask so that a part of the surface of the first well between the element separation region and the mask is exposed; and forming an impurity diffusion layer, which has a concentration of an impurity lower than that of the drain region and which is connected to the drain region, on the surface of the first well by introducing an impurity of the second conductive type using the second resist mask.

2. A method for manufacturing a semiconductor device according to claim 1 wherein the conductive film formed on the upper surface of the semiconductor layer is made of polycrystalline silicon.

3. A method for manufacturing a semiconductor device according to claim 1, wherein said forming a drain region comprises introducing the impurity of the second conductive type using the first resist mask by introducing arsenic (As) with an energy of approximately 60 keV and a dosage of approximately $1 \times 10^{15}/cm^2$.

4. A method for manufacturing a semiconductor device according to claim 1, wherein said forming an impurity diffusion layer comprises introducing the impurity of the second conductive type using the second resist mask by introducing arsenic (As) with an energy of approximately 30 keV and a dosage of approximately at $1 \times 10^{13}/cm^2$.

5. A method for manufacturing a semiconductor device according to claim 1, wherein the first and second resist masks are formed by dry etching.

6. A method for manufacturing a semiconductor device according to claim 1, wherein the first and second resist masks are formed by wet etching in which a mixed solution of hydrofluoric acid and nitric acid is used.

7. A method for manufacturing a semiconductor device according to claim 1, wherein the mask is removed after said forming a drain region.

8. A method for manufacturing a semiconductor device according to claim 7, wherein a width of the mask is roughly more than 0.3 $\mu$m measured from an edge of first well contacting the drain region.

9. A method for manufacturing a semiconductor device according to claim 1, wherein said forming an impurity diffusion layer comprises:

introducing the impurity of the second conductive type using the second resist mask; and performing a heat treatment on the semiconductor layer to form the impurity diffusion layer as having the concentration of an impurity lower than that of the drain region.

10. A method for manufacturing a semiconductor device according to claim 9, wherein said performing a heat treatment comprises heating the semiconductor layer approximately at 900° C. and for 20–30 minutes after said introducing the impurity of the second conductive type, wherein the impurity diffusion layer is formed by the heat treatment.

11. A method for manufacturing a semiconductor device according to claim 9, wherein said performing a heat treatment is implemented after said introducing the impurity of the second conductive type, wherein the impurity diffusion layer is formed by the heat treatment, and a width of the mask is roughly more than 0.3 $\mu$m measured from an edge of the first well contacting the drain region.

12. A method for manufacturing a semiconductor device according to claim 9, wherein said performing a heat treatment is implemented after said introducing the impurity of the second conductive type, wherein the impurity diffusion layer is formed by the heat treatment, and a width of the mask is roughly less than 0.2 $\mu$m measured from an edge of the first well contacting the drain region.

13. A method for manufacturing a semiconductor device according to claim 9, further comprising forming an additional impurity diffusion layer of a first conductive type as a D-well connection region on a partial region of the source region to be continuous with an inside of the second well.

14. A method for manufacturing a semiconductor device according to claim 9, further comprising forming an additional impurity diffusion layer of a first conductive type as a D-well connection region on a partial region of the source region, to be continuous with an inside of the second well, by introducing boron (B) with an energy of approximately 30 keV and a dosage of approximately at $1 \times 10^{15}/cm^2$.

15. A method for manufacturing a semiconductor device, comprising:

forming a first well of a second conductive type on a surface of a semiconductor layer of a first conductive type surrounded by an element separation region;

forming a second well of the first conductive type on a surface of the first well;

forming a source region on a surface of the second well;

forming a conductive film on an upper surface of the semiconductor layer;

patterning the conductive film to simultaneously form a gate electrode and a mask, the gate electrode being formed on the semiconductor layer to extend from the source region to the second well and the first well, and the mask being formed on the first well set apart from the gate electrode;

forming a first resist mask on the semiconductor layer including the gate electrode and the mask, an end of the first resist mask being set on the mask, so that a surface of the first well between the element separation region and the mask is exposed;

forming a drain region on the surface of the first well and a source electrode-connection region on the source region through self alignment by introducing an impurity of the second conductive type using the mask, the gate electrode and the first resist mask together as an impurity mask;

removing the mask and the first resist mask;

forming a second resist mask on the semiconductor layer including the gate electrode and the mask, an end of the second resist mask being set on the gate electrode with a surface of the first well between the element separation region and the gate electrode being exposed; and forming an impurity diffusion layer, which has a concentration of an impurity lower than that of the drain region and which is connected to the drain region, on the surface of the first well by introducing an impurity of the second conductive type using the second resist mask.

* * * * *